US012620954B2

(12) United States Patent
Becker

(10) Patent No.: US 12,620,954 B2
(45) Date of Patent: May 5, 2026

(54) PRESSURE-CONTROLLED AUDIO DUCKING CIRCUIT

(71) Applicant: Andrew Becker, Westminster, CO (US)

(72) Inventor: Andrew Becker, Westminster, CO (US)

( * ) Notice: Subject to any disclaimer, the term of this patent is extended or adjusted under 35 U.S.C. 154(b) by 181 days.

(21) Appl. No.: 18/715,282

(22) PCT Filed: Mar. 4, 2024

(86) PCT No.: PCT/US2024/018383
§ 371 (c)(1),
(2) Date: May 31, 2024

(87) PCT Pub. No.: WO2024/186753
PCT Pub. Date: Sep. 12, 2024

(65) Prior Publication Data
US 2025/0279758 A1 Sep. 4, 2025

Related U.S. Application Data

(60) Provisional application No. 63/488,285, filed on Mar. 3, 2023.

(51) Int. Cl.
*H03G 3/32* (2006.01)
*H03G 1/00* (2006.01)
*H04R 3/00* (2006.01)

(52) U.S. Cl.
CPC ............. *H03G 3/32* (2013.01); *H03G 1/0035* (2013.01); *H04R 3/00* (2013.01); *H04R 2420/01* (2013.01); *H04R 2430/01* (2013.01)

(58) Field of Classification Search
CPC .......... H03G 3/32; H03G 1/0035; H04R 3/00; H04R 2420/01; H04R 2430/01
USPC ......................................................... 381/107
See application file for complete search history.

(56) References Cited

U.S. PATENT DOCUMENTS

2015/0110294 A1    4/2015   Chen et al.
2016/0079947 A1*   3/2016   Kirsch ................ G10L 21/0208
                                                                  381/107

OTHER PUBLICATIONS

Jones. "What Is Ducking and How Can It Make You Sound Better Live?" Blog from Harman Professional Solutions Insights. Mar. 17, 2020 ( Mar. 17, 2020). Retrieved on May 7, 2024. Retrieved from: <URL: https://pro.harman.com/insights/av/what-is-ducking-andhow-can-it-help-you-sound-better-live/> entire document, pp. 1-4.

(Continued)

*Primary Examiner* — Paul Kim
(74) *Attorney, Agent, or Firm* — Lerner David LLP

(57) ABSTRACT

The present disclosure provides for a togglable audio ducking device preferably with a mechanically triggered pressure-sensitive floor pad that detects pressure when a user's body weight is in the proximity of the microphone. The mechanically triggered pressure-sensitive floor pad may allow the user to effectively reduce ambient noise bleed into microphones without muting the microphone (i.e. audio ducking). In other embodiments, the togglable audio ducking device may be operated using a magnetic switch attached to a microphone stand, which is triggered when the microphone stand rotates in a particular direction to a certain degree.

20 Claims, 14 Drawing Sheets

(56)     References Cited

OTHER PUBLICATIONS

Elliot. "Signal Detecting Audio Ducking Unit," Project 183 of Blog from Elliot Sound Products. Nov. 11, 2020 (Nov. 11, 2020). Retrieved on May 7, 2024. Retrieved from <URL:https://sound-au. com/projectl83.htm> entire document, pp. 1-6.
International Search Report for Application No. PCT/US2024/ 018383 mailed May 15, 2024. 2 pgs.

* cited by examiner

PRESSURE-CONTROLLED AUDIO DUCKING CIRCUIT

CROSS-REFERENCE TO RELATED APPLICATIONS

This application is a national stage entry under 35 U.S.C. § 371 of International Application No. PCT/US2024/01838, filed on Mar. 4, 2024, which claims priority to U.S. Provisional Patent Application No. 63/488,285, filed on Mar. 3, 2023, entitled "Pressure-Controlled Audio Ducking Circuit", the disclosures of which are hereby incorporated herein by reference in their entireties.

BACKGROUND

Microphones capture sound waves in the air and turn them into electrical signals. To replicate the original audio, the electrical signals can be sent from the microphone's output to a mixer or audio interface for recording, amplification, and/or distribution to speakers. In live sound applications, unwanted sound waves can often be captured and amplified when users move away from the microphone's diaphragm, which exposes the microphone to ambient sound sources in the room. Such an occurrence is also known as microphone "bleed."

An existing solution to this problem is known as a "noise gate" which systematically determines when levels have dropped below a certain threshold and subsequently reduces the microphone output level by a set range. A limitation with noise gates is that levels must return to a point higher than the cut-off threshold for the microphone to operate at full volume. This processing time can adversely produce an abrupt reintroduction of sound, cutting off the initial milliseconds of the intended sound capture.

BRIEF SUMMARY

The present disclosure provides for a togglable audio ducking device preferably with a mechanically triggered pressure-sensitive floor pad that detects pressure when a user's body weight is placed on the pressure-sensitive floor pad. The mechanically triggered pressure-sensitive floor pad may allow the user to effectively reduce ambient noise bleed into microphones without muting the microphone (i.e. audio ducking). In other embodiments, the togglable audio ducking device may be operated using a magnetic switch attached to a microphone stand, which is triggered when the user rotates the microphone stand to a certain degree in a particular direction.

In one aspect of the present disclosure, a togglable audio ducking device comprises: an audio circuit, a power circuit, an audio ducking switch, and an audio ducking circuit configured to reduce a level of an audio signal into the audio circuit, wherein the audio circuit, the power circuit, the audio ducking switch, and the audio ducking circuit are in togglable electronic communication, and wherein the audio ducking switch has a first position which allows for electronic communication between the audio circuit and the power circuit, and a second position which prevents the electronic communication between the audio circuit and the power circuit.

In some examples, the device further comprises an optimized power source, wherein the optimized power source is in electronic communication with the audio circuit, the power circuit, the audio ducking switch, and the audio ducking circuit.

In some examples, the audio circuit comprises an audio input, an audio output, a power connection port, an interfacing connection, and at least one solid-state array.

In some examples, the audio ducking circuit comprises at least one solid-state array, a capacitor, and a resistor.

In some examples, the device further comprises a plurality of solid-state relays, wherein the audio ducking circuit is configured to adjust a level of a gain reduction of the audio signal based on switching a current path and an audio path from the audio input to one or more of the plurality of solid-state relays.

In some examples, the device further comprises a single solid-state relay, wherein the audio ducking circuit is configured to adjust a level of a gain reduction of the audio signal based on one or more resistance pathways.

In some examples, the plurality of solid-state relays is configured to provide a parallel resistance between the audio ducking switch and the audio output to provide the level of the gain reduction relative to a cumulate resistance of the audio circuit.

In some examples, the device further comprises a network of switchable resistors, wherein the network of switchable resistors is configured to create one or more pathways of the audio signal from the audio ducking switch to the audio output to provide one or more use-selectable gain reduction levels of the audio signal.

In some examples, the network of switchable resistors includes at least two or more resistors with varying resistances.

In some examples, the device further comprises an indicator light, wherein the indicator light is configured to turn on in response to the audio ducking switch being activated.

In some examples, the audio ducking switch is a pressure-sensitive switch.

In some examples, the power circuit comprises a DC protection circuit, a DC ripple protection circuit, a plurality of status LEDs, a pressure-sensitive pad, and a hold capacitor, where the hold capacitor is configured to provide for the extended togglable bypass of the audio ducking switch, disallowing electronic communication between the audio circuit and the power circuit.

In some examples, the pressure-sensitive pad comprises a connection cable, a first conductive layer, a first non-conductive layer, a second conductive layer, a second non-conductive layer and a third non-conductive layer, wherein the third non-conductive layer is configured to have at least one perforation, wherein the first conductive layer has at least one protrusion which interfaces with the at least one perforation, and wherein the at least one protrusion is configured to provide for the togglable electronic communication of the first conductive layer and the second conductive layer.

In some examples, the first conductive layer and the second conductive layer are configured to provide togglable electronic communication therebetween upon application of pressure to the pressure-sensitive pad.

In some examples, the audio ducking switch is a magnetic switch.

In some examples, the power circuit comprises a DC protection circuit, a DC ripple protection circuit, a plurality of status LEDs, a magnetic sensor, and a hold capacitor, wherein the hold capacitor is configured to provide for extended togglable bypass of the magnetic switch, disallowing electronic communication across the audio ducking circuit.

In some examples, the magnetic switch comprises a magnetic sensor and a magnet trigger, wherein the magnetic sensor includes a metallic reed arm connected to at least two conductive leads.

In some examples, the magnetic switch is connected to the audio ducking circuit and the magnetic switch is attached to a microphone stand.

In some examples, the two conductive leads are configured to come into contact in response to a rotation of the microphone stand with the magnetic switch connected to the audio ducking circuit, and wherein the audio ducking circuit is configured to be deactivated in response to the two conductive leads coming into contact.

In some examples, the two conductive leads are configured to pull away from each other in response to a second rotation of the microphone stand with the magnetic switch connected to the audio ducking circuit, and wherein the audio ducking circuit is configured to be activated in response to the two conductive leads being pulled away from each other.

DETAILED DESCRIPTION

Figure 1:
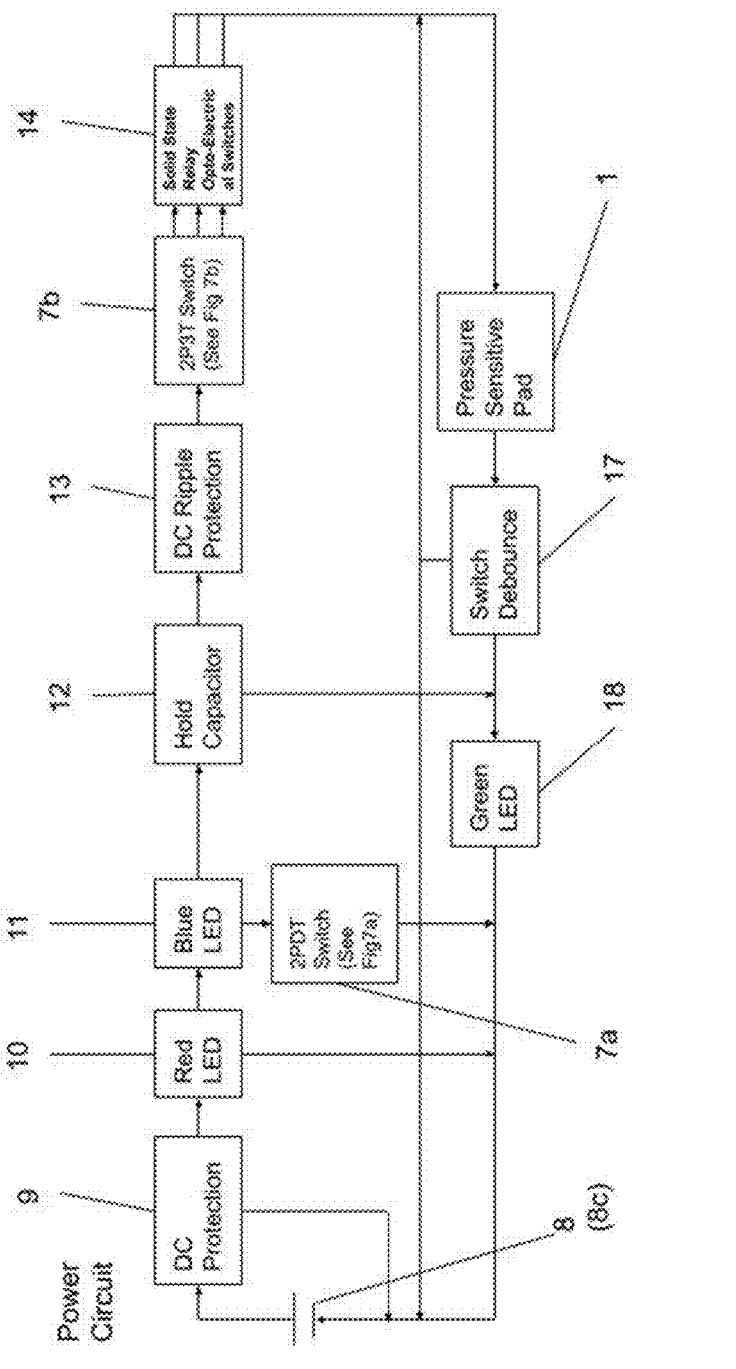
FIG. 1 is a schematic diagram of the pressure-controlled audio ducking circuit in accordance with an aspect of the disclosure.

The preferred embodiments of the present invention will now be described with reference to the drawings. Identical elements in the various figures are identified with the same reference numerals.

Reference will now be made in detail to each embodiment of the present invention. Such embodiments are provided by way of explanation of the present invention, which is not intended to be limited thereto in any manner whatsoever. In fact, those of ordinary skill in the art may appreciate upon reading the present specification and viewing the present drawings that various modifications and variations can be made thereto.

For purposes of the present disclosure of the invention, unless specifically disclaimed, the singular includes the plural and vice-versa, the words "and" and "or" shall be both conjunctive and disjunctive, the words "any" and "all" shall both mean "any and all".

The present disclosure provides for a togglable audio ducking device that can reduce the audio levels of an audio source which may be bypassed by activating either a pressure-sensitive switch or a magnetic switch. The togglable microphone ducking device may comprise two parts: (1) a power circuit; and (2) an audio circuit. These two parts may be isolated from each other although they may interact with each other through various components.

FIG. 1 illustrates a power system of a togglable audio ducking system using a pressure-sensitive pad. Power can be supplied by an optimized power source 8 which connects through a power connection jack 8c mounted on the device interface (I/F) 19 (not shown in FIG. 1). The power supplied by the optimized power source 8 can be configured to pass through a power protection circuit 9 which comprises reverse polarity protection and current smoothing capacitors. The optimized power source 8 may be optimized for power indication light 10, audio ducking circuit activation light 11, and for an array of solid-state relays 14 which are included in the audio ducking circuit ("ADC"). The components of the ADC are further described in detail below in connection with FIGS. 6, 7, 7a, and 7b. It is noted that any process of minimizing energy consumption can be used to optimize the power source 8. Any array of solid-state relays 14 with proper switching such as 2P3T switch 7b can be configured to provide users with different magnitudes of gain reduction based on the parallel resistance design of the arrays. In other embodiments, the parallel resistance design may be implemented using a switchable network of resistors.

Hold capacitor 12 can be configured to optimize the sustained hold of the ADC bypass when a user steps on or applies pressure on pressure-sensitive pad 1. The capacitance of the hold capacitor 12 can be preconfigured to hold the bypass state of the ADC for approximately one (1) to two (2) seconds. In other embodiments, the capacitance value can be changed to any value within a range of microseconds to a few seconds to either increase or decrease the hold time. The duration of the hold time can be delayed for as long as the capacitance can allow. Hold capacitor 12 can also be designed to have lower capacitance to provide a short hold time. In other embodiments, hold capacitor 12 can be omitted to provide the shortest possible hold time.

DC ripple protection circuitry 13 can be configured to smooth current to protect the solid-state relays 14. The value of the ripples of the DC ripple protection circuitry 13 may be preconfigured to meet the technical specifications of any type of solid-state relay. In some embodiments, DC ripple protection circuitry 13 can be omitted.

In one embodiment, at least two user-activated switches may be configured to connect through the device I/F 19 (not shown in FIG. 1). For example, a 2P2T switch 7a can be configured to control the indication of whether the ADC is being activated or bypassed using the light indicator 11. 2P3T switch 7b can be configured to switch between the power and audio signals to three (3) stages of the ADC (described in further detail below). The number of stages does not need to be limited to three. For example, the number can be four, five, or six, etc. The type and/or mechanism of the switching may include a computer-controlled digital switch, or any other known switching system or switchable network of switches capable of isolating the power and audio signal.

Pressure-sensitive pad 1 may be configured to connect to device I/F 19 via Tip Ring Sleeve (TRS) connector 5. In other embodiments, any other type of connector can be used to connect pressure-sensitive pad 1 to device I/F 19 as long as the pressure-sensitive pad is mechanically compatible with adjoining connectors through a minimum 2-conductor connection.

Switch debounce 17 may comprise a standard RC circuit containing a resistor connected to the ground and a capacitor connected to the pressure-sensitive pad 1. The design and/or configuration of switch debounce 17 may be adjusted based on a desired time of smoothing of the electrical properties of the pressure-sensitive pad 1.

Indicator light 18 can be configured to signal the activation of pressure-sensitive pad 1 In other embodiments, indicator light 18 can be omitted.

In yet other embodiments, a single solid-state relay can be connected between DC ripple protection circuitry 13 and 2P3T switch 7*b*. If the single solid-state relay is connected between DC ripple protection circuitry 13 and 2P3T switch 7*b*, a network of resistors may replace the array of solid-state relay 14. In such a case, the network of resistors may be connected between 2P3T switch 7*b* and pressure-sensitive pad 1.

Figures 2, 3:
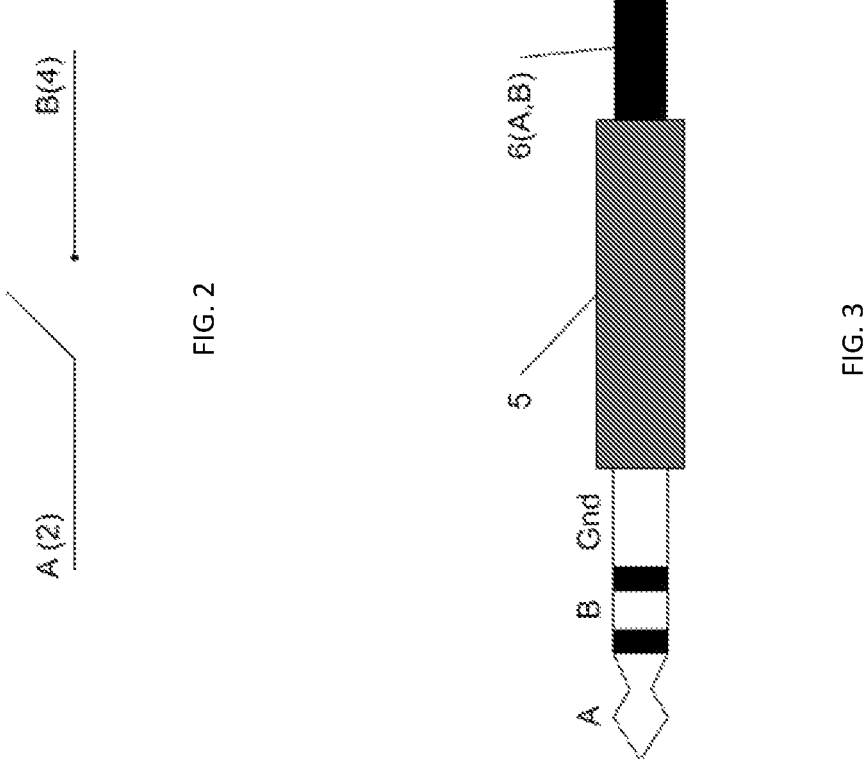
FIG. 2 is a diagram of a switch within the pressure-sensitive pad in accordance with an aspect of the disclosure.
FIG. 3 is a diagram of a TRS connector in accordance with an aspect of the disclosure.
Figure 4:
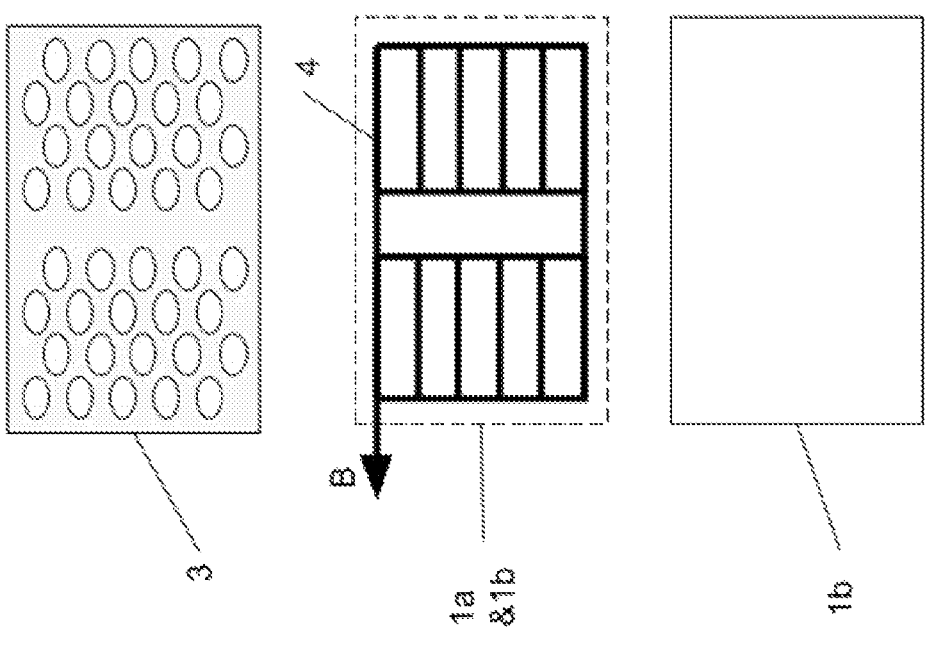
FIG. 4 illustrates a schematic view of the layers within the pressure-sensitive pad in accordance with an aspect of the disclosure.
Figure 4:
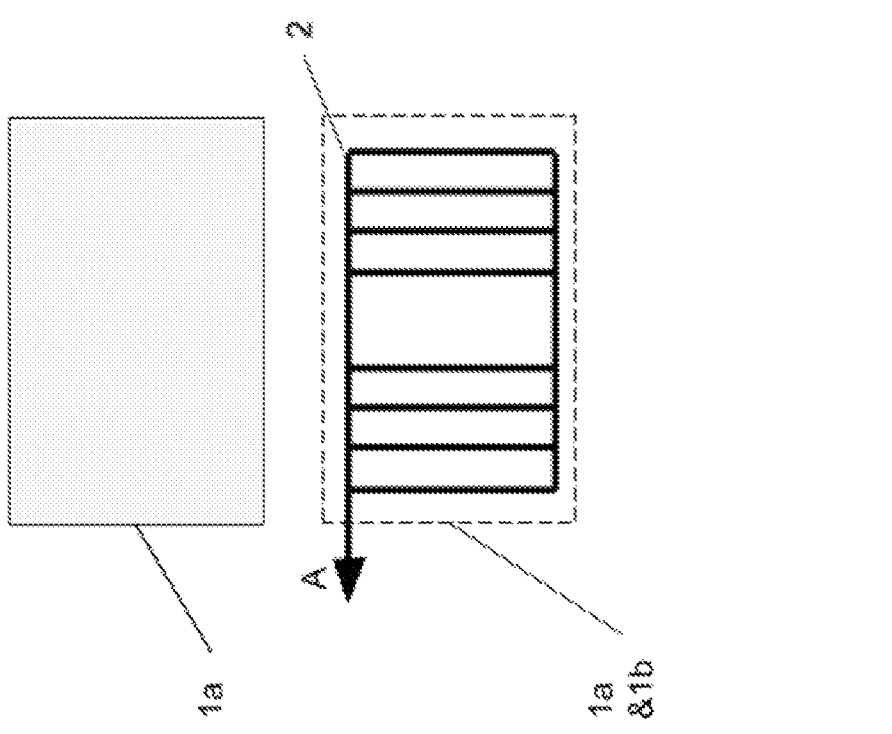

FIGS. 2-4 illustrate each component of the pressure-sensitive pad 1 in accordance with the present disclosure.

FIG. 2 illustrates a switch within the pressure-sensitive pad 1. The pressure-sensitive pad switch illustrated in FIG. 2 can disconnect or connect circuit A 2 and circuit B 4. Circuit A 2 and circuit B 4 can include conductive arrays printed on a flexible plastic non-conductive medium. The components of each array can be any medium that is conductive and attachable to cable 6 described below. The array design can be of any design that can be effectively activated by a user. The properties of the materials used in the pressure-sensitive pad switch can be selected to allow the user to have a desired outcome without unnecessary activation delay when the user uses any ducking device containing the apparatus described herein. The size of the pressure-sensitive area of the pressure-sensitive pad switch can vary in accordance with the pressure-sensitive pad's electrical design's compatibility with the electrical design of the ducking device.

FIG. 3 is a diagram of a TRS connector 5. A ¼" TRS connector may have three terminals. In some embodiments, terminal A is intended for the transmission of circuit A 2 and terminal B is intended for the transmission of circuit B 4. Ground terminal may be wired to a ground wire that serves as an electromagnetic interface shield to cable 6. The ground wire can be used as a strengthening element for cable 6 without being wired into any circuit. Any length or type of cable and connector may be used as long as the connector can transmit to at least two circuits and is suitable for any kind of electrical design of any audio ducking device.

FIG. 4 illustrates a schematic view of the layers within the pressure-sensitive pad. Pressure-sensitive pad enclosures 1*a* and 1*b* may consist of a heat-sealable vinyl material that is non-conductive, moisture resistant, and may enclose layers 2 and 4. The material for pressure-sensitive pad enclosures 1*a* and 1*b* can be any non-conductive material. To enhance durability, foldability, and functionality, a medium-thickness vinyl with a middle seam and contrasting color sides can be selected. The aforementioned attributes can be adjusted based on color size, seam/seamlessness, or durability. In other examples, materials such as carpet, or open and closed cell foams can be used. Layer 2 may be connected to circuit A 2 and layer 4 may be connected to circuit B 4. As described in connection with FIG. 2, circuit A 2 and circuit B 4 may comprise two (2) independent conductive arrays printed on a flexible plastic non-conductive medium. The design of such arrays can be changed to ensure a portion of a user's body weight when placed in the surface area of a footprint, will force conductivity between layers 2 and 4. Layer 3 may consist of closed cell foam with precise perforations to serve as a non-conductive layer between circuit A 2 and circuit B 4. Layer 3 can be placed between circuit A 2 and circuit B 4. When the user's body weight is not compressing layer 3, the switch described in FIG. 2 can be in an open state to prevent the current flow between circuit A 2 and circuit B 4. The thickness and density of the foam can be designed to accommodate the user's weight. Any non-conductive medium capable of keeping circuit A 2 and B 4 separate when no weight is applied and allowing circuits A 2 and B 4 to connect when proper weight is applied can be used.

Figure 5:
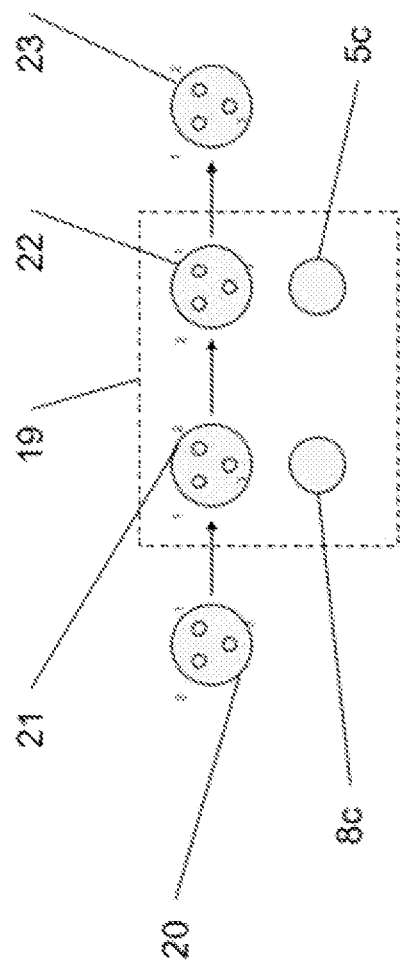
FIG. 5 is a diagram of a balanced audio circuit in accordance with an aspect of the disclosure.

FIG. 5 illustrates a balanced audio circuit of the togglable audio ducking device. A microphone cable male end 20 can be connected to an "input" external Line Return (XLR) female connector jack 21 which can be configured to be mounted on device I/F 19. The connection using the aforementioned XLR connector may be a balanced audio signal connection with positive, negative, and ground signals. Although the industry standard balanced audio XLR connector can be used, any three (3) conductor balanced audio connector can work with the togglable audio ducking device described herein. Signals transmitted to the "input" XLR female connector jack 21 may be sent directly to the "output" XLR male connector jack 22 which is also mounted on the device I/F 19. A user may connect from the "output" XLR male connector jack 22 to a standard microphone cable female end (23) to the next desired stage of sound processing. Power connection jack 8*c* and pressure-sensitive pad jack 5*c* can be mounted on the device I/F 19. Power connection jack 8*c* can connect to the optimized power source 8 as illustrated in FIG. 1 and pressure-sensitive pad jack 5*c* can connect to TRS connector 5 as illustrated in FIG. 3, respectively.

Figure 6:
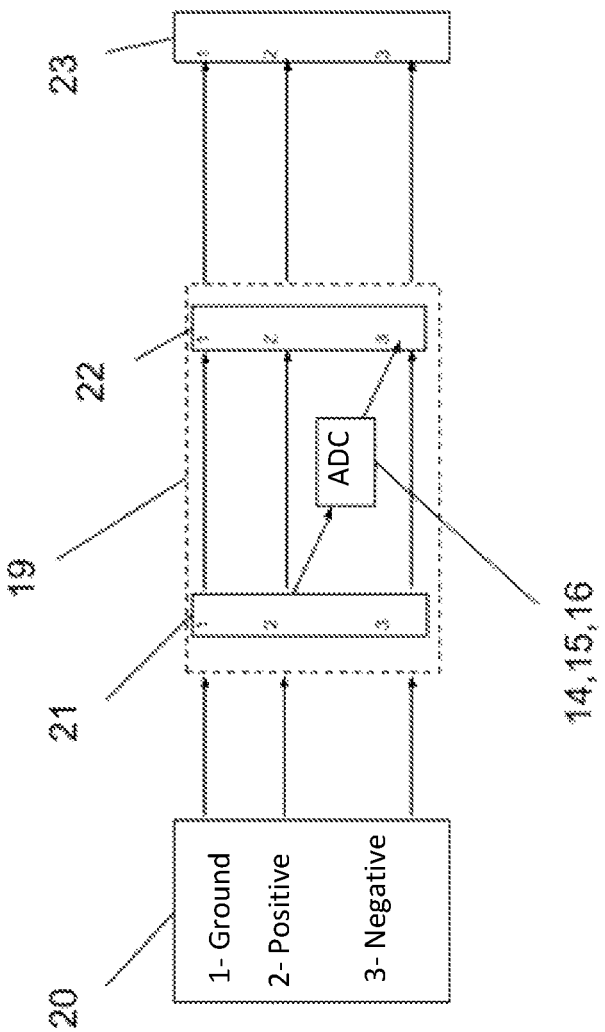
FIG. 6 is a diagram illustrating the pin connections of the audio circuit in accordance with an aspect of the disclosure.

FIG. 6 illustrates the pin wirings of the balanced audio connections and the audio ducking circuit (ADC). Microphone cable male end 20, "input" XLR female connector jack 21, "output" XLR male connector jack 22, and microphone cable female end 23 may comprise three (3) pins: ground, positive and negative pins. Each pin of each cable end may be connected to the corresponding pin of the connector jacks. For example, pin 1 of microphone cable male end 20 may be connected to pin 1 of "input" XLR female connector jack 21 and pin 1 of "input" XLR female connector jack 21 may be connected to pin 1 of "output" XLR male connector jack, etc. The ADC components (solid-state relays 14, resistor 15, and capacitor 16 described in connection with FIG. 7A below) can be connected between pin 2 of the "input" XLR female connector jack 21 and pin 3 of the "output" XLR male connector jack 22. In other embodiments, the ADC components may be connected between pin 3 of the "input" XLR female connector jack 21 and pin 2 of the "output" XLR male connector jack 22.

Figure 7A:
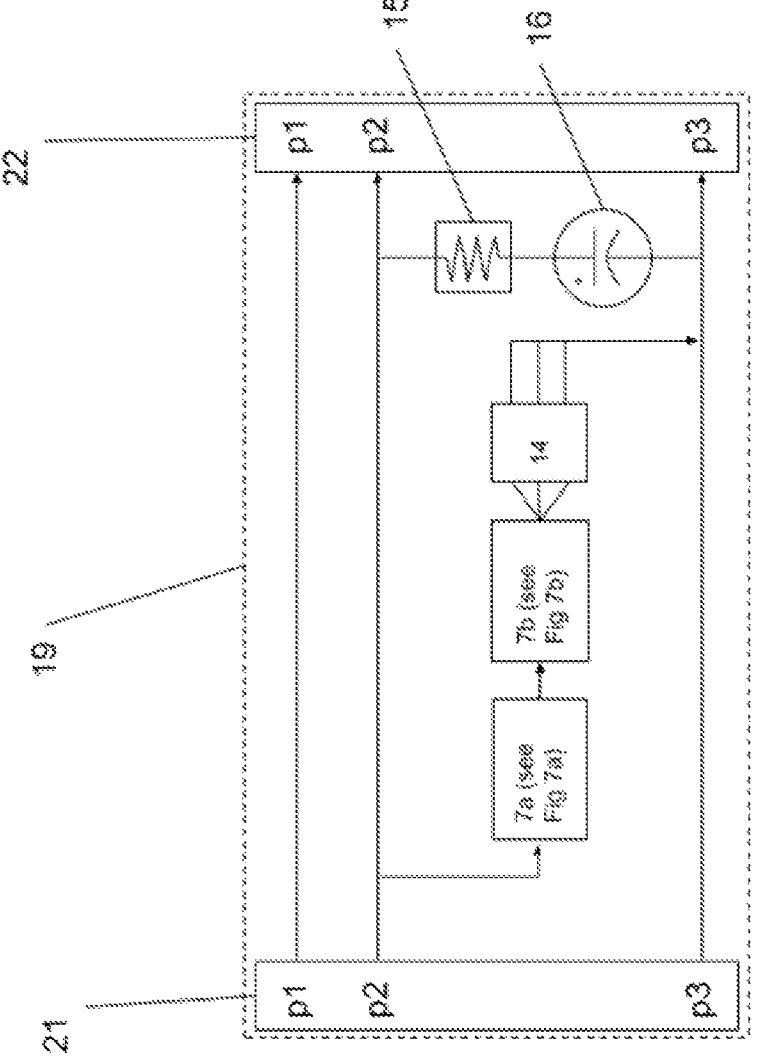
FIG. 7A is a diagram illustrating the construction of the audio ducking circuit in accordance with an aspect of the disclosure.

FIG. 7A illustrates the details of the audio ducking circuit (ADC). Balanced audio may be transmitted from the audio source and connectors via "input" XLR female jack 21 mounted on device I/F 19. While audio signals can connect directly to the respective pins of "output" XLR female jack 22, an alternate path between pin (p2) of "input" XLR female connector jack 21 and pin (p3) of "output" XLR male connector jack 22 may be connected. The aforementioned path may be connected using 2P2T switch 7a, 2P3T switch 7b, and solid-state relays 14. Additionally, 47 kΩ resistor 15, and 470 uF capacitor 16 can be connected between the p2-p2 path and the p3-p3 path. When the pressure-sensitive pad 1 is deactivated by the user (i.e. weight is removed), the solid-state relay 14's control pins are deactivated, and the signal terminal becomes a closed circuit by closing pin 2, which in turn shorts the path between p2 of "input" XLR female connector jack 21 and p3 of "output" XLR male connector jack 22. When the path is shorted, capacitor 16 may discharge through resistor 15. Because of the inherent on-resistance of solid-state relays 14, the parallel resistance may reduce the total resistance, thereby causing a gain reduction in the audio input level relative to the cumulative resistance. By switching the current path and audio path to solid-state relays 14 with different on-state resistance, users may be able to choose an appropriate gain reduction level for the ADC. It is to be noted that any type of solid-state relays can be used to achieve a ducking or muting effect in the audio circuitry with the resulting gain reduction relative to the above parallel resistance. In other embodiments, the parallel resistance pathway can be designed using only one solid state relay connected to a network of switchable resistor pathways to create various user-selectable gain reduction levels within the ADC.

Figure 7B:
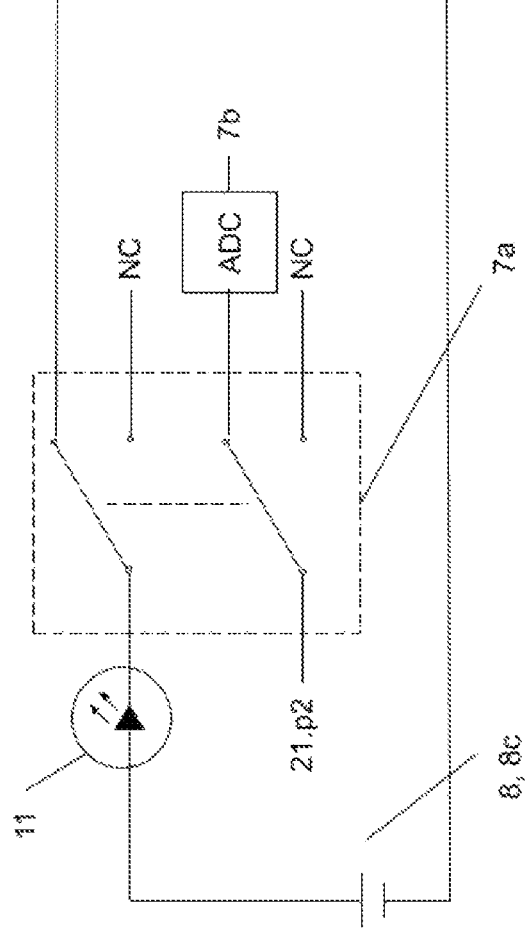
FIG. 7B is a diagram showing a 2P2T switch in accordance with an aspect of the disclosure.

FIG. 7B is a diagram showing a 2P2T switch in greater detail. Pole 26 of 2P2T switch 7a can connect the "input" XLR female jack 21's pin 2 to either 2P3T switch 7b or an open lead "No connect" ("NC"). Pole 25 of the 2P2T switch may close the power circuit through the ADC light indicator 11 to indicate activation or bypass of the ADC.

Figure 7C:
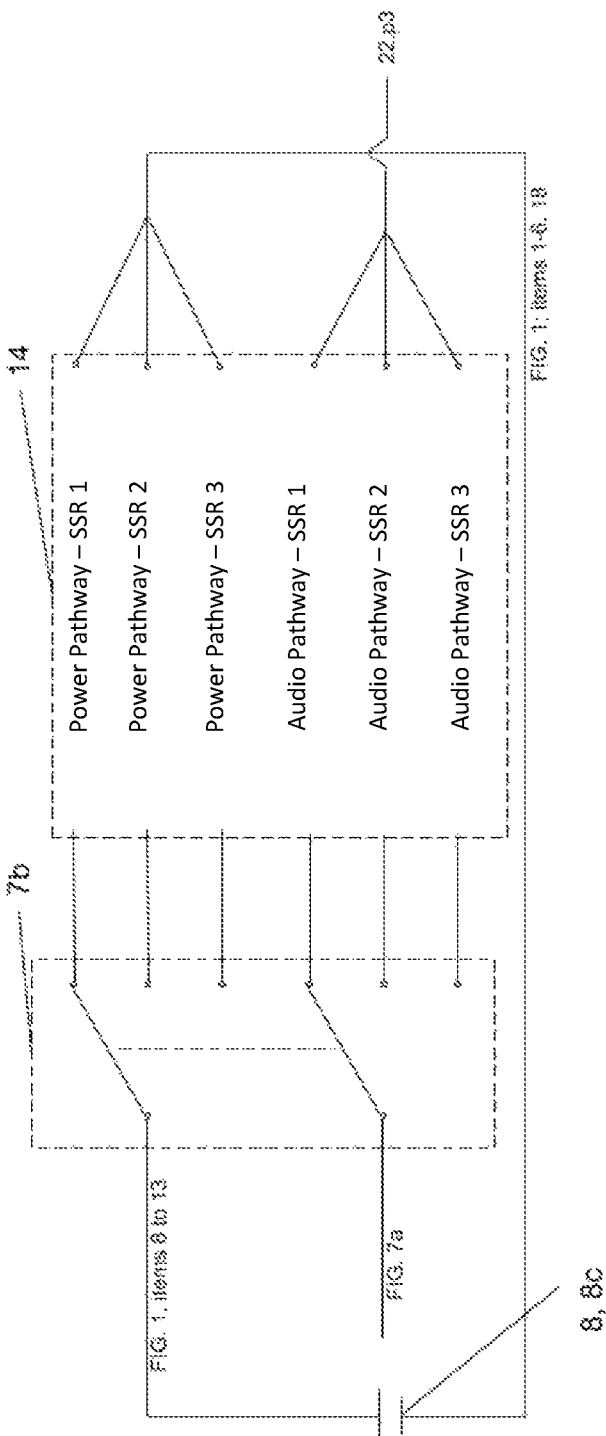
FIG. 7C is a diagram showing the audio and power circuit pathways using multiple solid-state relays in accordance with an aspect of the disclosure.

FIG. 7C is a diagram showing a 2P3T switch 7b connected to a network of solid-state relays 14. A power circuit and audio circuit may transmit to switch 7b as separate pathways. Optimized power source 8 may connect through power input jack 8c mounted on device I/F 19. Once the power arrives at 2P3T switch 7b, the current can be switched to one of three pathways: power pathways—Solid-State Relay 1 (SSR 1), Solid-State Relay 2 (SSR 2), and Solid-State Relay 3 (SSR 3). The negative terminals of these relays can join together on a common negative pathway and may be connected to the pressure-sensitive pad 1, switch debounce circuitry 17, and ADC indicator light 18. 2P3T switch 7b can be connected to either the negative or positive side of the solid-state relay 14.

FIG. 7C also illustrates an audio circuit pathway. The audio signal may pass from 2P2T switch 7a and can be routed to the "switch" side of SSR 1, SSR 2, and SSR 3. After the audio signals are transmitted to one of the three relays the audio signals are summed with the audio outputs of the other relays before being sent to the "output" XLR male connector jack 22.

Figure 7D:
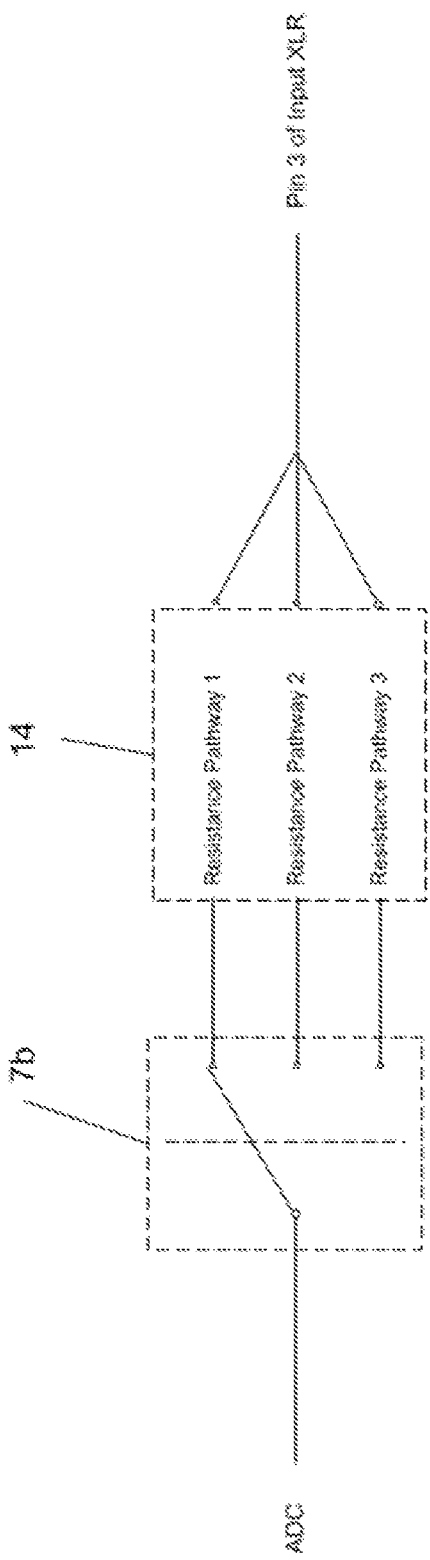
FIG. 7D is a diagram showing the audio circuit pathways using a single solid-state relay and a network of resistors in accordance with an aspect of the disclosure.

FIG. 7D is a diagram showing a 1P3T switch 7c connected in the ADC between p2 of the "input" XLR female connector jack 21, network of resistors 14A, and p3 of the "output" XLR male connector jack 22. The resistance in resistance pathway 1 may be configured to be 0 ohms, the resistance in resistance pathway 2 may be configured to have a value higher than 0 ohms, and resistance in resistance pathway 3 may be configured to have a higher ohm value than that of the resistance in resistance pathway 2.

Figure 8A:
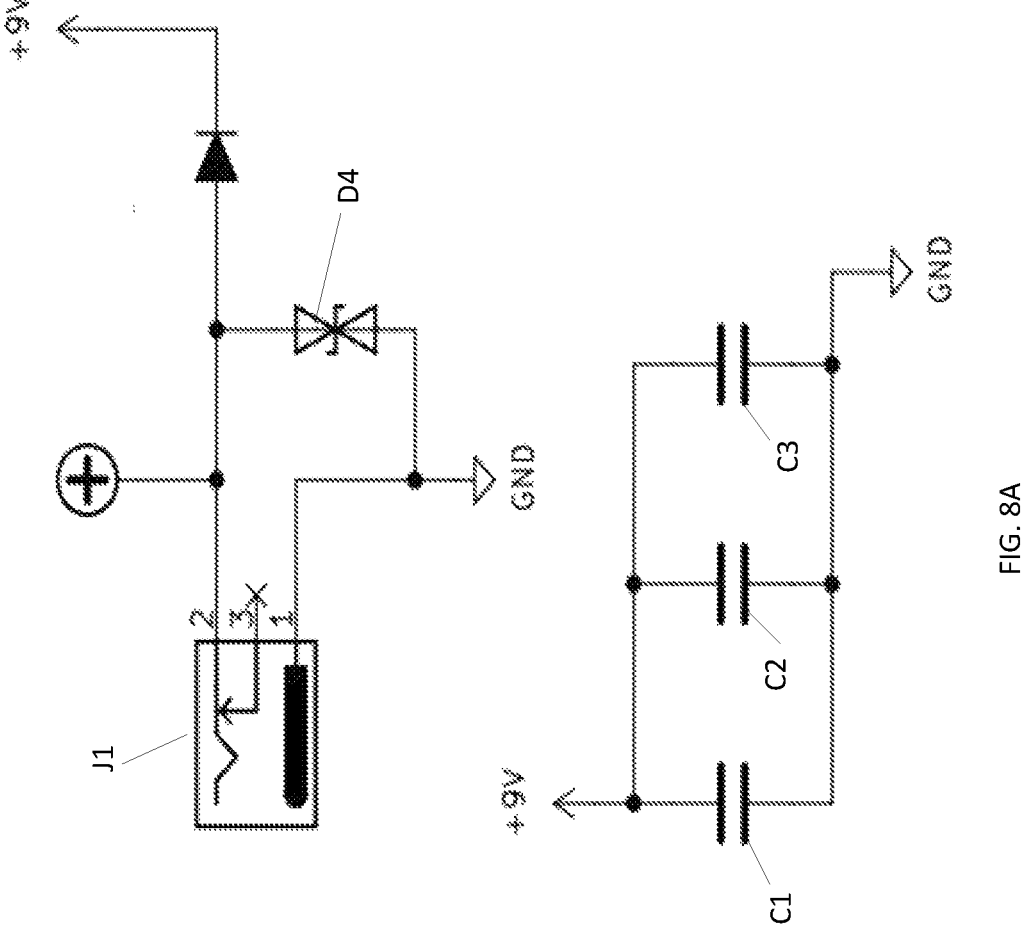
FIGS. 8A-C are schematic diagrams of the pressure-controlled audio ducking circuit in accordance with an aspect of the disclosure.

FIG. 8A is a schematic diagram of the circuit board comprising power connection jack J1 corresponding to power connection jack 8c illustrated in FIG. 1, power protection circuit 9 including a reverse polarity protection diode D4, and current smoothing capacitors C1-C3.

Figure 8B:
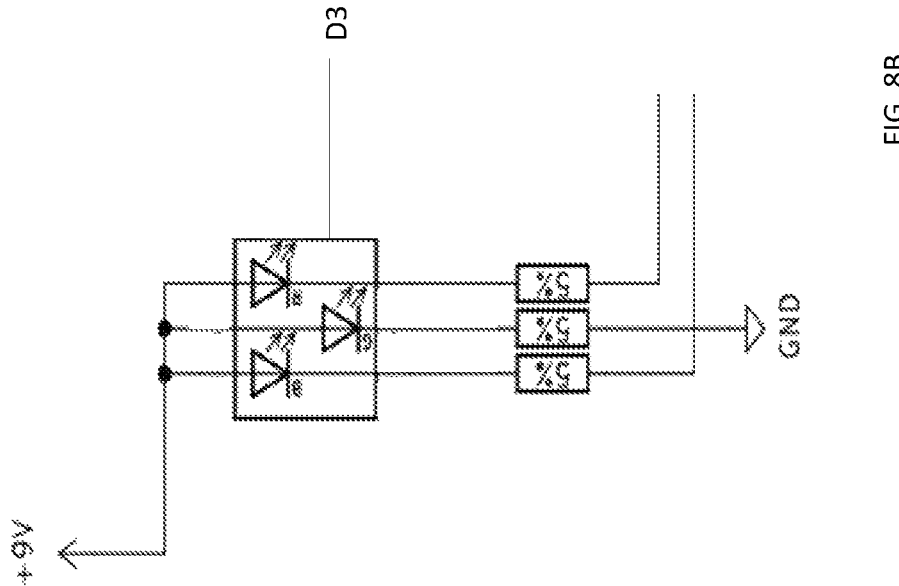

FIG. 8B is a schematic diagram of the circuit board comprising a group of circuit routings for power indicator light 10, audio ducking circuit (ADC) activation light 11, and indicator light 18 illustrated as D3.

Figure 8C:
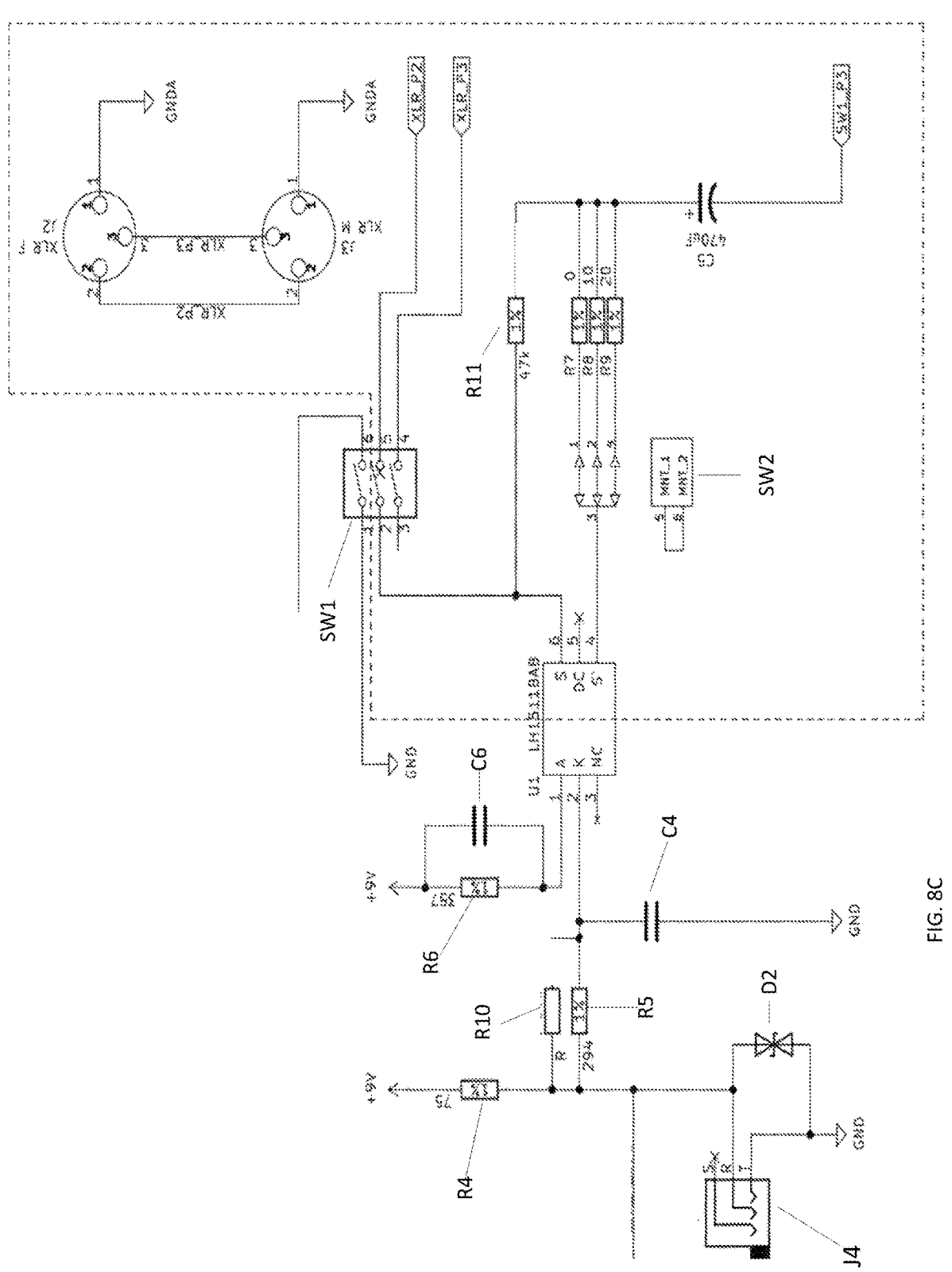

FIG. 8C is a schematic diagram of the audio ducking circuit board Using a 1P3T switch 7c to direct audio signal between p2 of "input XLR female connector jack 21, a network of resistors 14, and p3 of "output" XLR male connector jack 22. Circuit board part J4 corresponds to the TRS jack 5c illustrated in FIG. 5. Diode D2 indicates the location of hold capacitor 12. Resistors R4, R5, R6, R10, and capacitors C4, and C6 can be configured to reduce switch bounce and smooth the current when the pressure-sensitive pad 1 is activated by the user's body weight. Switch SW2 may correspond to the 1P3T switch 7c routing to the three resistor options for the users to select heavy, medium, or light gain reduction in the microphone level. Resistor R11 corresponding to 47 kΩ resistor 15, and capacitor C5 corresponding to 470 uF capacitor 16 illustrated in FIG. 1 may be placed between the XLR connectors XLR_P2 and XLR_P3. Switch SW1 may correspond to a user bypass switch populated with a 2P2T switch 7a which may be configured to control the indication of the ADC light indicator 11 that indicates activation or bypass of the ADC.

Figure 9A:
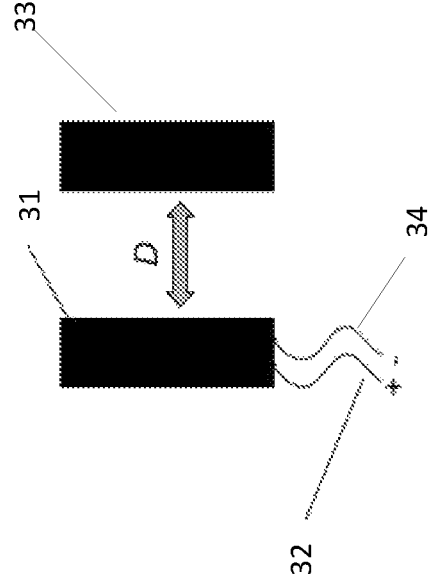
FIGS. 9A-B are schematic diagrams of a microphone magnetic switch in accordance with an aspect of the disclosure.
Figure 9B:
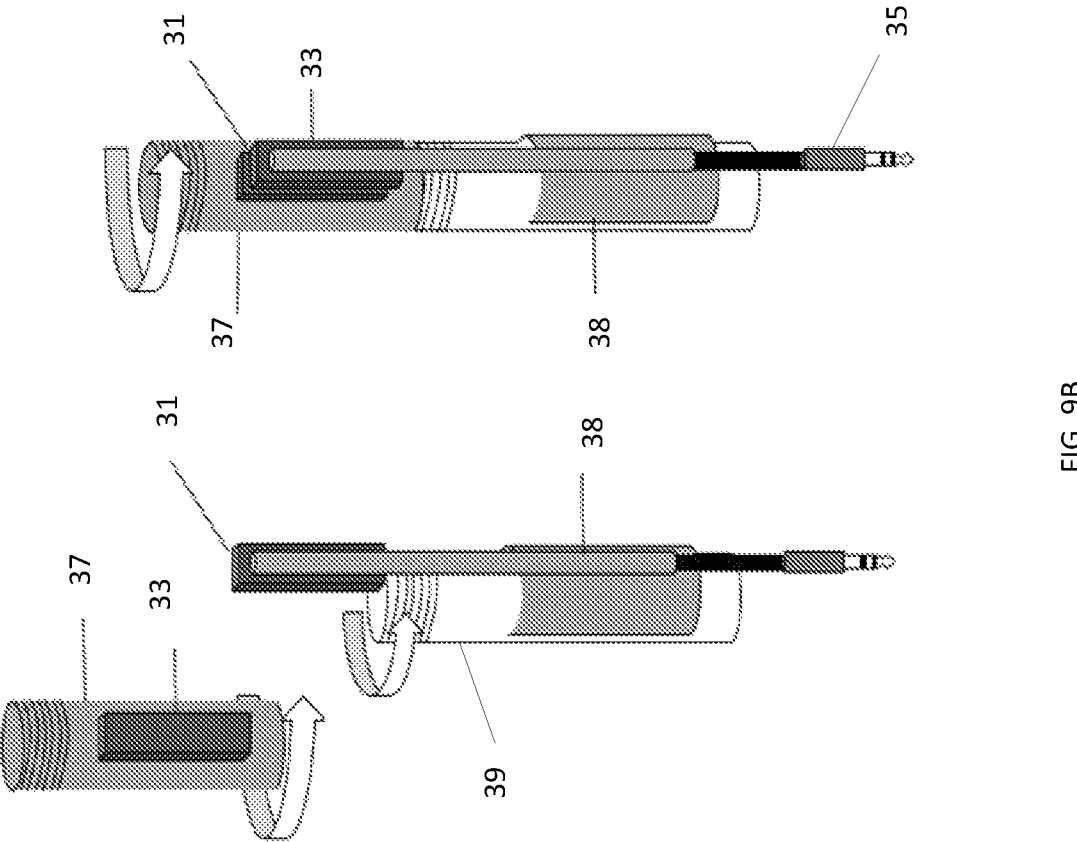

FIGS. 9A-B are schematic diagrams of a microphone magnetic switch. FIG. 9A illustrates components of a magnet reed switch that may be used to switch the audio ducking circuit instead of the pressure-sensitive pad. The magnetic switch can be attached to a microphone stand. The magnetic switch may comprise magnetic sensor 31 and magnetic trigger 33. Magnetic sensor 31 may include one magnetic reed acting as a mechanical switch between two circuit leads 32 and 34 therewithin. Magnetic trigger 33 can be any type of magnet configurable to generate a magnetic field that may move the metallic reed arm connecting leads 32 and 34 to contact with each other or move away from each other inside the magnetic sensor 31. The first lead 32 may be connected to circuit A 2 and the second lead 34 may be connected to circuit B 4, or vice versa. If two leads 32 and 34 are connected, circuit A 2 and circuit B 4 may be connected to activate bypass of the ADC.

The proximity of magnetic sensor 31 and magnetic trigger 33 to each other may be preconfigured to define a threshold force to trigger the metallic reed arm to connect leads 32 and 34. Each magnet may have various strengths; thus, the proximity determined by a degree of rotation may vary in accordance with the designs of a magnetic switch and a microphone stand. In other embodiments, the direction and degree of the rotation can be manually adjusted according to user preference.

FIG. 9B illustrates a microphone stand extender containing a magnetic switch on the exterior. The above-described magnetic switch can be attached to a microphone stand's vertical post. Microphone stand extender 37 can be threaded to the top of any type of microphone stand 39. Magnetic trigger 33 may be attached to the exterior of microphone stand extender 37. A clip-on magnetic sensor 38 includes magnetic sensor 31 and can be attached to the lower post of the microphone stand 39 using any known clip-on mechanism, such that when the microphone stand extender 37 is rotated to a certain degree in a particular direction, the proximity of magnetic sensor 31 relative to the position of magnetic trigger 33 changes. When the distance between magnetic sensor 31 and magnetic trigger 33 becomes less than a preconfigured threshold distance, the metallic reed arm inside the magnetic sensor 31 can join leads 32 and 34 in FIG. 9A. When the user rotates the microphone stand extender 37 in an opposite direction or rotates farther in the same direction, the distance between magnetic sensor 31 and magnetic trigger 33 exceeds the preconfigured threshold distance, and thus pulls away the metallic reed arm from connecting leads 32 and 34 in FIG. 9A, thereby activating the ADC. Clip-on magnetic sensor 38 may include connector 35. Connector 35 may be a TRS connector connected to device I/F 19. Any other type of connector with necessary circuit conductors can also be used to connect clip-on magnetic sensor 38 to the device I/F 19.

In other embodiments, a different type of magnet switch such as a hall effect switch can be used. The microphone stand extender 37 can be replaced with a second microphone stand clip which may connect to another portion of a factory microphone stand.

It is further understood that, although ordinal terms, such as, "first," "second," and "third," are used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, a "first element," "component," "region," "layer" and/or "section" discussed below could be termed a second element, component, region, layer and/or section without departing from the teachings herein.

Features illustrated or described as part of one embodiment can be used with another embodiment and such variations come within the scope of the appended claims and their equivalents.

Spatially relative terms, such as "beneath," "below," "lower," "above," "upper" and the like, are used herein for ease of description to describe one element or feature's relationship to another element(s) or feature(s) as illustrated in the figures. It is understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the example term "below" can encompass both an orientation of above and below. The device can be otherwise oriented (rotated 90 degrees or at other orientations) and the spatially relative descriptors used herein interpreted accordingly.

Example embodiments are described herein with reference to cross-section illustrations that are schematic illustrations of idealized embodiments. As such, variations from the shapes of the illustrations, for example, of manufacturing techniques and/or tolerances, are to be expected. Thus, example embodiments described herein should not be construed as limited to the particular shapes of regions as illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A togglable audio ducking device, comprising:
an audio circuit;
a power circuit;
an audio ducking switch; and
an audio ducking circuit configured to reduce a level of an audio signal into the audio circuit,
wherein the audio circuit, the power circuit, the audio ducking switch, and the audio ducking circuit are in togglable electronic communication, and
wherein the audio ducking switch has a first position which allows for electronic communication between the audio circuit and the power circuit, and a second position which prevents the electronic communication between the audio circuit and the power circuit.

2. The device of claim 1, further comprising an optimized power source, wherein the optimized power source is in electronic communication with the audio circuit, the power circuit, the audio ducking switch, and the audio ducking circuit.

3. The device of claim 2, wherein the audio circuit comprises an audio input, an audio output, a power connection port, an interfacing connection, and at least one solid-state array.

4. The device of claim 3, wherein the audio ducking circuit comprises at least one solid-state array, a capacitor, and a resistor.

5. The device of claim 4, further comprising a plurality of solid-state relays, wherein the audio ducking circuit is configured to adjust a level of a gain reduction of the audio signal based on switching a current path and an audio path from the audio input to the plurality of solid-state relays.

6. The device of claim 5, wherein the plurality of solid-state relays is configured to provide a parallel resistance between the audio ducking switch and the audio output to provide the level of the gain reduction relative to a cumulate resistance of the audio circuit.

7. The device of claim 4, further comprising a single solid-state relay, wherein the audio ducking circuit is configured to adjust a level of a gain reduction of the audio signal based on one or more resistance pathways.

8. The device of claim 4, further comprising a network of switchable resistors, wherein the network of switchable resistors is configured to create one or more pathways of the audio signal from the audio ducking switch to the audio output to provide one or more use-selectable gain reduction levels of the audio signal.

9. The device of claim 8, wherein the network of switchable resistors includes at least two or more resistors with varying resistances.

10. The device of claim 1, further comprising an indicator light, wherein the indicator light is configured to turn on in response to the audio ducking switch being activated.

11. The device of claim 1, wherein the audio ducking switch is a pressure-sensitive switch.

12. The device of claim 11, wherein the power circuit comprises a DC protection circuit, a DC ripple protection circuit, a plurality of status LEDs, a pressure-sensitive pad, and a hold capacitor, wherein the hold capacitor is configured to provide for extended togglable bypass of the audio ducking switch, disallowing audio communication across the audio ducking circuit.

13. The device of claim 12, wherein the pressure-sensitive pad comprises a connection cable, a first conductive layer, a first non-conductive layer, a second conductive layer, a second non-conductive layer, and a third non-conductive layer, wherein the third non-conductive layer is configured to have at least one perforation, wherein the first conductive layer has at least one protrusion which interfaces with the at least one perforation, and wherein the at least one protrusion is configured to provide for the togglable electronic communication of the first conductive layer and the second conductive layer.

14. The device of claim 13, wherein the first conductive layer and the second conductive layer are configured to provide togglable electronic communication therebetween upon application of pressure to the pressure-sensitive pad.

15. The device of claim 1, wherein the audio ducking switch is a magnetic switch.

16. The device of claim 15, wherein the power circuit comprises a DC protection circuit, a DC ripple protection circuit, a plurality of status LEDs, a magnetic sensor, and a hold capacitor, wherein the hold capacitor is configured to provide for extended togglable bypass of the magnetic switch, disallowing electronic communication across the audio ducking circuit.

17. The device of claim 16, wherein the magnetic switch comprises a magnetic sensor and a magnet trigger, wherein the magnetic sensor includes a metallic reed arm connected to at least two conductive leads.

18. The device of claim 17, wherein the magnetic switch is connected to the audio ducking circuit, wherein the magnetic switch is attached to a microphone stand.

19. The device of claim 18, wherein the two conductive leads are configured to come into contact in response to a first rotation of the microphone stand with the magnetic switch connected to the audio ducking circuit, and wherein the audio ducking circuit is configured to be deactivated in response to the two conductive leads coming into contact.

20. The device of claim 19, wherein the two conductive leads are configured to pull away from each other in response to a second rotation of the microphone stand with the magnetic switch connected to the audio ducking circuit, and wherein the audio ducking circuit is configured to be activated in response to the two conductive leads being pulled away from each other.

\* \* \* \* \*